US006208678B1

(12) United States Patent
King

(10) Patent No.: US 6,208,678 B1
(45) Date of Patent: Mar. 27, 2001

(54) LASER PUMP SOURCE AND METHOD OF OPERATION THEREOF

(75) Inventor: Jonathan Paul King, Epping (GB)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/198,389

(22) Filed: Nov. 24, 1998

(51) Int. Cl.[7] ............................... H01S 3/093; G02B 6/42
(52) U.S. Cl. .................................. 372/72; 372/72; 372/6; 385/27; 385/45; 385/48
(58) Field of Search ............................ 372/72, 6, 23, 372/92; 385/27, 28, 45, 46, 48

(56) References Cited

U.S. PATENT DOCUMENTS 5,822,489 * 10/1998 Hale ...................................... 385/145

FOREIGN PATENT DOCUMENTS

19636236 * 6/1996 (DE) .

* cited by examiner

Primary Examiner—Frank G. Font
Assistant Examiner—Delma R. Flores Ruiz
(74) Attorney, Agent, or Firm—Lee, Mann, Smith, McWilliams, Sweeney & Ohlson

(57) ABSTRACT

A multi-mode pump laser having an output, and an optical fiber coupler. The optical fiber coupler has a first section and a second section. The first section of the optical fiber coupler comprises a multi-mode fiber which is optically coupled to the pump laser output. The second section of the fiber coupler comprises a plurality of single mode optical fibers each of which has an input which is optically coupled to the multi-mode fiber. The source further comprises a pump drive which is controllable to dither the optical center frequency of the light produced by the pump laser, so as to scramble modal power distribution at the inputs of the single mode optical fibers.

28 Claims, 2 Drawing Sheets

LASER PUMP SOURCE AND METHOD OF OPERATION THEREOF

FIELD OF THE INVENTION

This invention relates to a laser pump source and method of operation thereof, and more particularly to a laser pump source which provides a plurality of single mode laser pump outputs.

BACKGROUND OF THE INVENTION

One of the main areas of use of the laser pump source is in the optical pumping of fibre amplifiers for use in optical telecommunications systems.

Common optical amplifiers include rare earth doped fibre amplifier such as Erbium doped amplifiers. Such amplifiers demonstrate high gain and low noise. These devices also operate to amplify signals in the wavelength range 1.5 to 1.6 microns and as such cover the 1.54 microns window in silica optical fibres used in telecommunications.

Such amplifiers require pumping in one of their absorption bands at the 807 nm, 918 nm or 1480 nm. Multi-mode pumping may be used to pump fibre amplifiers using a method known as cladding pumping in which specially designed Erbium doped fibres are pumped by a multi-mode pump laser via the cladding of the Erbium doped fibre. However, this is a complex process requiring a special fibre design and is not suitable for most amplifiers. Also, this system can not be retrofitted to pump presently deployed amplifiers that do not include such fibres.

Single mode pumping may also be used. In this case a relatively low power single mode pump may be used to pump a single Erbium fibre amplifier or the output from a higher power, normally 980 manometer, single mode pump laser may be split to pump a plurality of fibres. In this case, passive fibre splitting would be used to provide the plurality of outputs. This method has its drawbacks in that single mode pumps are expensive in comparison to multi-mode pumps and the reliability of high power 980 manometer single mode pumps decreases super linearly (approximately cubicly) with output power. Hence, there will be reliability issues if a high power single mode pump is used to pump a plurality of Erbium doped fibre amplifiers.

SUMMARY OF THE INVENTION

It is therefore an object of the present invention to provide a plurality of sources of single mode pump light for pumping a plurality of individual laser amplifiers.

It is a further object of the present invention to provide an inexpensive laser pump source suitable for pumping a plurality of fibre amplifiers.

It is a still further object of the present invention to provide a plurality of sources of single mode pump light for use in a metro communications system.

It is a still further object of the present invention to provide a method of provision of a plurality of single mode optical pump sources.

It is a still further object of the present invention to provide an optical fibre coupler for use with a laser pump source and method of operation thereof.

FIELD OF THE INVENTION

The first three above referenced objects of the invention are attained utilising a laser pump source comprising a multi-mode pump laser having an output, an optical fibre coupler having a first section and a second section, the first section of the optical fibre coupler comprising a multi-mode fibre which is optically coupled to the pump laser output, the second section of the fibre coupler comprising a plurality of single mode optical fibres each of which has an input which is optically coupled to the multi-mode fibre, and a pump drive which is controllable to dither the optical centre frequency of the light produced by the pump laser so as to scramble modal power distribution at the inputs of the single mode optical fibres.

Preferably, the second section of the fibre coupler is a fused tapered single mode fibre bundle.

Preferably, the fused tapered single mode fibre bundle is matched to the core diameter and numerical aperture of the multi-mode fibre.

Preferably, the fibre bundle comprises a plurality of optical fibres, so arranged as to present a substantially circular cross-sectional profile.

In one embodiment the fibre bundle comprises 7 single mode fibres.

In another embodiment the fibre bundle comprises 19 single mode fibres.

Preferably, the pump drive is controllable to scramble modal power distribution by producing optical frequency dither in the pump laser.

Preferably, the frequency of the optical frequency dither is greater than approximately 10 kHz.

Preferably, the first and second sections of the fibre coupler are physically fused together.

Alternatively, the first and second sections of the fibre coupler are optically coupled through an expanded beam connector.

Preferably, the multi-mode fibre is approximately 1 m long.

The fourth of the above referenced objects of the invention is attained utilising a method of providing a plurality of single mode optical pump sources, comprising the steps of:

providing a laser pump source comprising a multi-mode pump laser having an output, providing an optical fibre coupler having a first section and a second section, the first section of the optical fibre coupler comprising a multi-mode fibre, the second section of the fibre coupler comprising a plurality of single mode optical fibres each of which has an input, optically coupling the multi-mode fibre to the pump laser output, optically coupling each of said single mode optical fibres to the multimode fibre and providing a pump drive which is controllable to dither the optical centre frequency of the light produced by the pump laser so as to scramble modal power distribution at the inputs of the single mode optical fibres.

Preferably, the step of providing said second section of the fibre coupler comprises providing a fused tapered single mode fibre bundle.

Preferably, the step of providing said fused tapered single mode fibre bundle comprises the step of matching the core diameter and numerical aperture of the bundle to that of the multi-mode fibre.

Preferably, the step of providing said fused tapered single mode fibre bundle comprises the step of providing a bundle comprising a plurality of optical fibres, so arranged as to present a substantially circular cross-sectional profile.

Preferably, the step of controlling the pump drive so as to scramble modal power distribution comprises producing optical frequency dither in the pump laser.

Preferably, the frequency of the optical frequency dither is greater than approximately 10 kHz.

Preferably, the step of optically coupling each of said single mode optical fibres to the first section of the optical fibre coupler, comprises the step of physically fusing together the first and second sections of the fibre coupler.

Alternatively, the step of optically coupling each of said single mode optical fibres to the first section of the optical fibre coupler, comprises the step of optically coupling the first and second sections of the optical coupler through an expanded beam connector.

The final above referenced object of the invention is attained utilising a laser pump source comprising:

a multi-mode pump laser having an output, and a pump drive which is controllable to dither the optical centre frequency of the light produced by the pump laser so as to scramble modal power distribution;

the optical fibre coupler having a first section and a second section, the first section of the optical fibre coupler comprising a multi-mode fibre which is optically couplable to the pump laser output, the second section of the fibre coupler comprising a plurality of single mode optical fibres each of which is optically coupled to the first section of the optical fibre coupler.

Preferably, the second section is a fused tapered single mode fibre bundle.

Preferably, the fused tapered single mode fibre bundle is matched to the core diameter and numerical aperture of the multi-mode fibre.

Preferably, the fibre bundle comprises a plurality of optical fibres, so arranged as to present a substantially circular cross-sectional profile.

In one embodiment the fibre bundle comprises 7 single mode fibres.

In another embodiment the fibre bundle comprises 19 single mode fibres.

Preferably, the first and second sections of the fibre coupler are physically fused together.

Preferably, the first and second sections of the fibre coupler are optically coupled through an expanded beam connector.

Preferably, the multi-mode fibre is approximately 1 m long.

It is an advantage of the present invention that a method of coupling a multi-mode laser pump source to a number of single mode fibre tails for pumping multiple optical amplifiers is produced.

BRIEF DESCRIPTION OF THE DRAWINGS

These and other object, aspects, features and advantages of the invention will become more apparent from the following detailed description, claims and drawings, in which:

DETAILED DESCRIPTION OF THE INVENTION

Figure 1:
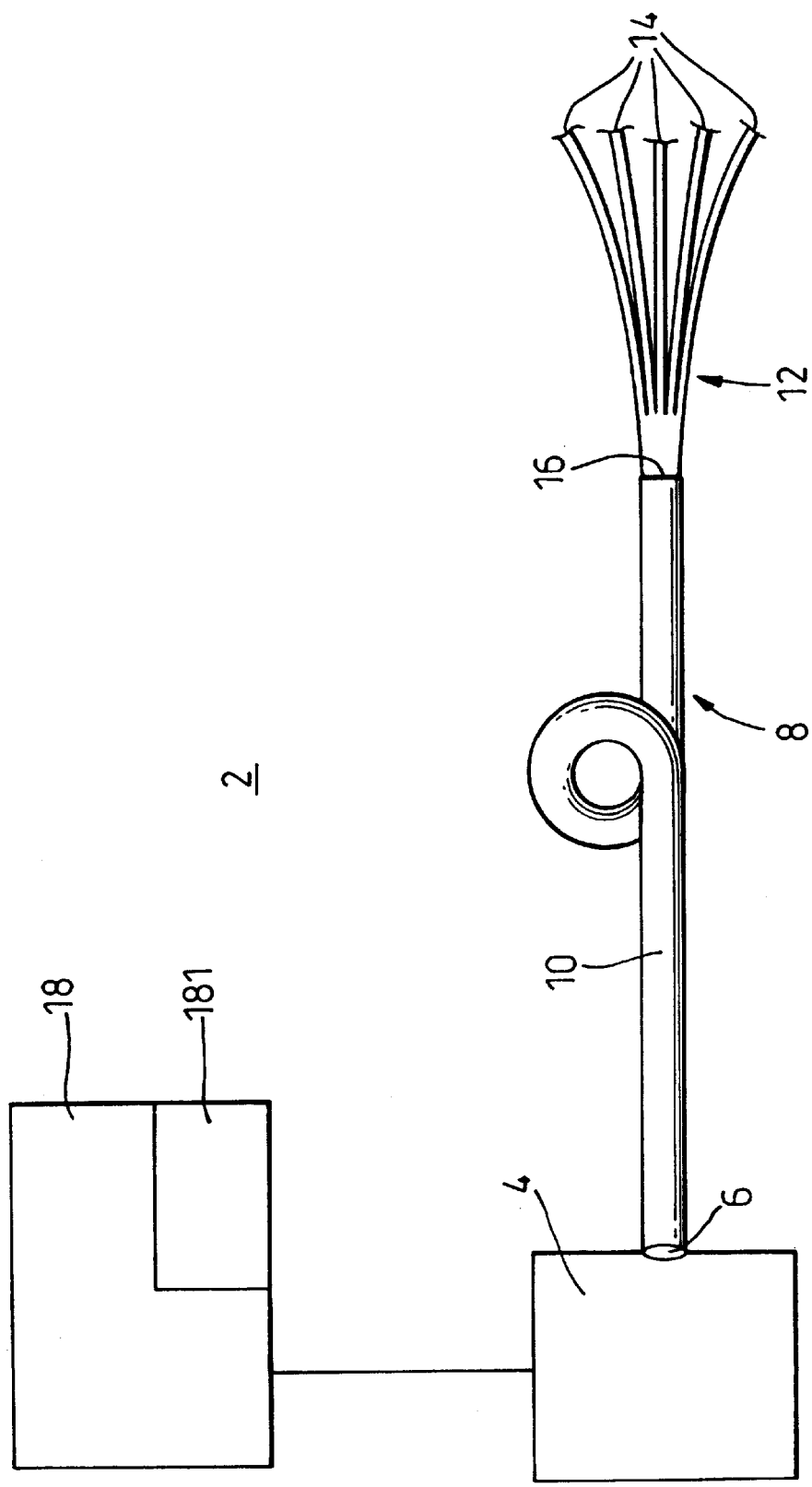
FIG. 1 is a schematic illustration of a laser pump source in accordance with the present invention.

Referring to FIG. 1, there is presented an embodiment of a laser pump source 2 in accordance with the present invention. The laser pump source 2, of FIG. 1, comprises a multi-mode pump laser 4 having an output 6. The output includes a standard lens arrangement capable of focussing the light output by the pump laser 4 into a cleaved end of an optical fibre. The pump source 2 further comprises an optical fibre coupler 8 having a first section 10 and a second section 12. The first section 10 of the optical fibre coupler is a multi-mode fibre which is optically coupled to the pump laser output 6. The second section of the fibre coupler is a plurality of single mode optical fibres 14 each of which has an input 16 which is optically coupled to the multi-mode fibre. The laser pump source 2 still further comprises a pump drive 18 which is controllable to dither the optical centre frequency of the light produced by the pump laser 4 so as to scramble modal power distribution at each of the inputs 16 of the single mode optical fibres 14.

Figure 2:
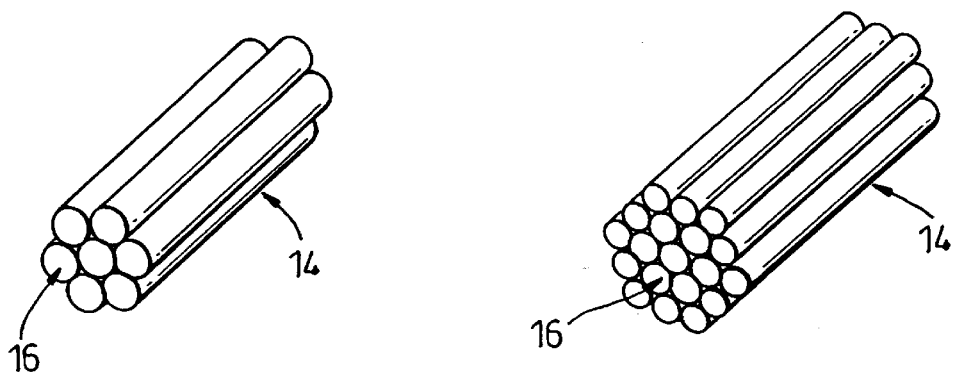
FIG. 2 is a schematic illustration of a cross section through a single mode fibre bundle.

The core diameter and numerical aperture (NA) of the fused tapered single mode fibre bundle is matched to that of the multi-mode fibre. The fibre bundle comprises a plurality of optical fibres, normally either 7 or 19 fibres, which are arranged so as to present a substantially circular cross-sectional profile, as illustrated in FIG. 2. This arrangement, when the fused bundle is tapered, allows easier matching of the end surface of the tapered bundle to the end surface of the multi-mode fibre.

The pump drive 18 includes a dither drive 181 which scrambles the modal power distribution at the end of the multi-mode fibre which in this embodiment is co-positioned with the inputs of the single mode fibres 14 by producing an optical frequency dither in the pump laser. The optical frequency dither is greater than approximately 10 kHz.

The period associated with the dither is less than the lifetime of the excited state of the Erbium in the Erbium fibre amplifier. Thus a dither is produced which results in the injection of light into each of the fibres 14 before the excited state of the Erbium fibres (to which the single mode fibres will ultimately be connected) can decay from an excited state. Thus the Erbium is maintained in an excited state.

Figure 3:
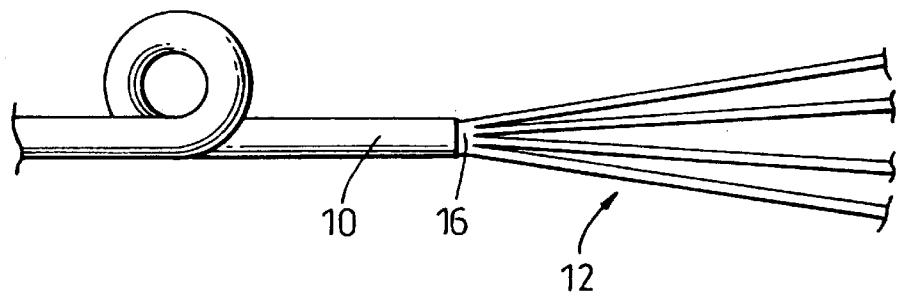
FIG. 3 is a schematic illustration of the fibre bundle of FIG. 3 which has been fused and tapered for optical coupling with a multi-mode fibre.

As mentioned above, the multi-mode fibre and each of the single mode fibres 14 are physically fused or spliced together in this embodiment, as illustrated in FIG. 3.

Figure 4:
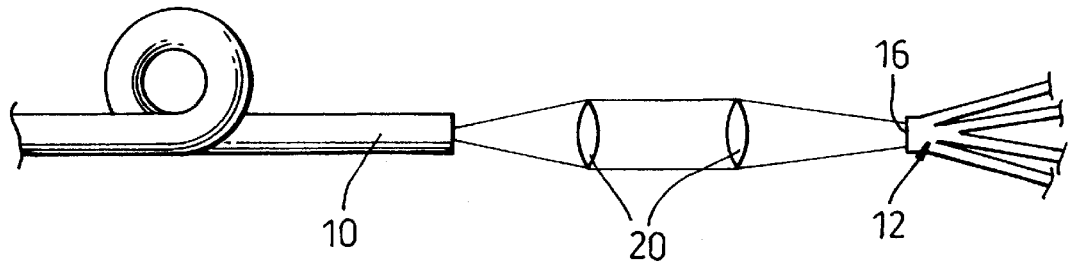
FIG. 4 is a schematic illustration of a further embodiment of the present invention, wherein the single mode and multi-mode fibres are optically coupled through an expanded beam connector.

FIG. 4 illustrates an embodiment of the present invention wherein the output of the multi-mode fibre is injected into the input 16 of the single mode fibres 14 in the single mode fibre bundle through a system of microlenses in a standard expanded beam connector.

One method for fabricating single-mode fibre bundles is to gently twist together a number of fibres which have been stripped of their protective coatings, to bring the fibres into close contact with each other, heating to fuse them together while pulling the fibre bundle to produce a fused and tapered region with an outer diameter commensurate with the multimode fibre to be coupled to. Once cooled the fused region can be cleaved and fusion spliced like a standard multimode fibre.

In order to achieve substantially circular geometry, the fibre bundle may consist of 7, 13, 19, 31 or 43 fibres. To maintain good circularity of the fused region, typically the fibres would be suspended vertically from a jig which holds the fibres at the top and bottom, to ensure the cross section of the twisted region is as shown in FIG. 2; with heating of the twisted area applied by a torrus flame to give even heating of all fibres in the bundle.

DITHER CONTROL UNIT

The dither control unit adds an AC modulation current to the laser DC drive current. The current modulation induces optical centre frequency modulation of the laser (through temperature and the injected carrier density modulation within the laser active region). Since each mode of the multimode fibre pigtail has a different effective length, the frequency dither results in a differential phase modulation between the modes, this modulates the coherent addition of modes at the end of the multimode pigtail, which averages out the the power distribution presented to the single mode fibre bundle, thus avoiding inhomogenous coupling due to modal noise. The dither frequency should be fast enough to average out the power distribution in a time period shorter than the Erbium excited state lifetime.

A laser pump source in accordance with the present invention can be used for a number of different purposes including pumping of a plurality of rare earth doped fibre amplifiers such as Erbium amplifiers, as discussed above. The laser pump source enables the coupling of a multi-mode pump laser to a number of single mode fibres by splicing the tapered fibre bundle to the multi-mode pigtail of the pump laser. Providing optical frequency dither of the pump output to average out the inhomogeneous coupling due to model noise at the multi-mode to multiple single mode junction ensures that each amplifier to which the laser pump source is coupled is maintained in an excited state. The pump source 2 is ideal for use in metro systems in which a number of Erbium amplifiers are located in one site.

The invention overcomes the problem of cost, which is significant with the use of single mode pump lasers, and the problem of power restrictions, which is significant in systems using single mode pump lasers and pump power splitting.

When in use, one or more of the single mode fibres 14 in the fibre bundle is optically coupled to an optical amplifier, such as an Erbium amplifier, and the laser source 2 is actuated. The dither control unit 181 is also actuated so that the laser power or modal distribution at the inputs 16 of the single mode fibres 14 are equalised. In this way the output of each of the single mode fibres 14 is a single mode power output of roughly comparable power.

The foregoing description has been limited to specific embodiments of the invention. It will be apparent, however, that variations and modifications may be made to the invention without departing from the scope or spirit of the invention as claimed.

What is claimed is:

1. A laser pump source comprising
a multi-mode pump laser having an output,
an optical fibre coupler having a first section and a second section, the first section of the optical fibre coupler comprising a multi-mode fibre which is optically coupled to the pump laser output, the second section of the fibre coupler comprising a plurality of single mode optical fibres each of which has an input which is optically coupled to the multi-mode fibre, and
a pump drive which is controllable to dither the optical centre frequency of the light produced by the pump laser so as to scramble modal power distribution at the inputs of the single mode optical fibres.

2. The laser pump source of claim 1, wherein said second section of the fibre coupler is a fused tapered single mode fibre bundle.

3. The laser pump source of claim 2, wherein said fused tapered single mode fibre bundle is matched to the core diameter and numerical aperture of the multi-mode fibre.

4. The laser pump source of claim 2, wherein the fibre bundle comprises a plurality of optical fibres, so arranged as to present a substantially circular cross-sectional profile.

5. The laser pump source of claim 4, wherein the fibre bundle comprises 7 single mode fibres.

6. The laser pump source of claim 4, wherein the fibre bundle comprises 19 single mode fibres.

7. The laser pump source of claim 1, wherein the pump drive is controllable to scramble modal power distribution by producing optical frequency dither in the pump laser.

8. The laser pump source of claim 7, wherein the frequency of the optical frequency dither is greater than approximately 10 kHz.

9. The laser pump source of claim 1, wherein the first and second sections of the fibre coupler are physically fused together.

10. The laser pump source of claim 1, wherein the first and second sections of the fibre coupler are optically coupled through an expanded beam connector.

11. The laser pump of claim 1, wherein the multi-mode fibre is approximately 1 m long.

12. A method of providing a plurality of single mode optical pump sources, comprising the steps of:
providing a laser pump source comprising a multi-mode pump laser having an output,
providing an optical fibre coupler having a first section and a second section, the first section of the optical fibre coupler comprising a multi-mode fibre, the second section of the fibre coupler comprising a plurality of single mode optical fibres each of which has an input,
optically coupling the multi-mode fibre to the pump laser output,
optically coupling each of said single mode optical fibres to the multi-mode fibre
and providing a pump drive which is controllable to dither the optical centre frequency of the light produced by the pump laser so as to scramble modal power distribution at the inputs of the single mode optical fibres.

13. The method of claim 12, wherein the step of providing said second section of the fibre coupler comprises providing a fused tapered single mode fibre bundle.

14. The method of claim 13, wherein the step of providing said fused tapered single mode fibre bundle comprises the step of matching the core diameter and numerical aperture of the bundle to that of the multimode fibre.

15. The method of claim 13, wherein the step of providing said fused tapered single mode fibre bundle comprises the step of providing a bundle comprising a plurality of optical fibres, so arranged as to present a substantially circular cross-sectional profile.

16. The method of claim 12, wherein the step of controlling the pump drive so as to scramble modal power distribution comprises producing optical frequency dither in the pump laser.

17. The method of claim 16, wherein the frequency of the optical frequency dither is greater than approximately 10 kHz.

18. The method of claim 12, wherein the step of optically coupling each of said single mode optical fibres to the first section of the optical fibre coupler, comprises the step of physically fusing together the first and second sections of the fibre coupler.

19. The method of claim 12, wherein the step of optically coupling each of said single mode optical fibres to the first section of the optical fibre coupler, comprises the step of optically coupling the first and second sections of the optical coupler through an expanded beam connector.

20. An optical fibre coupler for use with a laser pump source comprising:

a multi-mode pump laser having an output, and a pump drive which is controllable to dither the optical centre frequency of the light produced by the pump laser so as to scramble modal power distribution;

the optical fibre coupler having a first section and a second section, the first section of the optical fibre coupler comprising a multi-mode fibre which is optically couplable to the pump laser output, the second section of the fibre coupler comprising a plurality of single mode optical fibres each of which is optically coupled to the first section of the optical fibre coupler.

21. The coupler of claim 20, wherein said second section is a fused tapered single mode fibre bundle.

22. The coupler of claim 21, wherein said fused tapered single mode fibre bundle is matched to the core diameter and numerical aperture of the multi-mode fibre.

23. The coupler of claim 21, wherein the fibre bundle comprises a plurality of optical fibres, so arranged as to present a substantially circular cross-sectional profile.

24. The coupler of claim 23, wherein the fibre bundle comprises 7 single mode fibres.

25. The coupler of claim 23, wherein the fibre bundle comprises 19 single mode fibres.

26. The coupler of claim 20, wherein the first and second sections of the fibre coupler are physically fused together.

27. The coupler of claim 20, wherein the first and second sections of the fibre coupler are optically coupled through an expanded beam connector.

28. The coupler of claim 20, wherein the multi-mode fibre is approximately 1 m long.

* * * * *